(12) United States Patent
Nozu et al.

(10) Patent No.: US 7,875,810 B2
(45) Date of Patent: Jan. 25, 2011

(54) ELECTRONIC COMPONENT-INSPECTION WIRING BOARD AND METHOD OF MANUFACTURING THE SAME

(75) Inventors: Kazuya Nozu, Aichi (JP); Toshihisa Nomura, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 117 days.

(21) Appl. No.: 11/952,260

(22) Filed: Dec. 7, 2007

(65) Prior Publication Data

US 2008/0138576 A1  Jun. 12, 2008

(30) Foreign Application Priority Data

| Dec. 8, 2006 | (JP) | ............................ 2006-332059 |
| Feb. 16, 2007 | (JP) | ............................ 2007-036064 |
| Feb. 16, 2007 | (JP) | ............................ 2007-036167 |

(51) Int. Cl.
*H01R 12/04* (2006.01)
*H05K 1/11* (2006.01)

(52) U.S. Cl. ........................................ 174/262; 29/846
(58) Field of Classification Search .......... 174/262–266
See application file for complete search history.

(56) References Cited

U.S. PATENT DOCUMENTS

| 5,292,574 | A | * | 3/1994 | Kata et al. | ................ | 428/209 |
| 5,855,711 | A | * | 1/1999 | Araki et al. | .............. | 156/89.16 |
| 6,406,778 | B1 | * | 6/2002 | Natarajan et al. | .......... | 428/209 |
| 6,413,620 | B1 | * | 7/2002 | Kimura et al. | .............. | 428/210 |
| 6,729,019 | B2 | * | 5/2004 | Grube et al. | .................. | 29/830 |
| 7,001,569 | B2 | | 2/2006 | Saitoh et al. | | |
| 7,569,177 | B2 | | 8/2009 | Saitoh et al. | | |

FOREIGN PATENT DOCUMENTS

| JP | 62-272588 A | 11/1987 |
| JP | 63-227097 A | 9/1988 |
| JP | 4-290297 A | 10/1992 |
| JP | 6-97655 A | 4/1994 |
| JP | 9-97861 A | 4/1997 |
| JP | 9-172258 A | 6/1997 |
| JP | 9-237855 A | 9/1997 |
| JP | 11-64442 A | 3/1998 |
| JP | 10-239354 A | 9/1998 |
| JP | 11-74645 A | 3/1999 |
| JP | 2005-136235 A | 5/2005 |
| JP | 2006-185977 A | 7/2006 |
| JP | 2006-275714 A | 10/2006 |
| WO | 2002/043455 A1 | 5/2002 |

* cited by examiner

*Primary Examiner*—Ishwarbhai B Patel
(74) *Attorney, Agent, or Firm*—Sughrue Mion, PLLC

(57) ABSTRACT

An electronic component-inspection wiring board including a first laminate composed of plural first ceramic layers and having pads formed on a front surface to transmit inspection signals to an electronic component, wiring layers formed between the first ceramic layers, and via-conductors connecting pads to the wiring layers exposed on a rear surface of the first laminate; and a second laminate composed of second ceramic layers having plural via-conductors extending between front surface and rear surface of the second laminate, wherein lands connecting a via-conductor exposed on the rear surface of the first laminate and a via-conductor exposed on the front surface of the second laminate are disposed between the first laminate and the second laminate, and the diameter d1 of the land is 2-5 times larger than the diameter d2 of a via-conductor connected to the land.

20 Claims, 8 Drawing Sheets

ELECTRONIC COMPONENT-INSPECTION WIRING BOARD AND METHOD OF MANUFACTURING THE SAME

BACKGROUND OF THE INVENTION

1. Field of the Invention

The present invention relates to a wiring board adapted for electronic component (such as IC and LSI chip) inspection of conductive properties, operability or defects, and to a method of manufacturing the same. More particularly, the present invention relates to an electronic component-inspection wiring board (probe card-wiring board) made of ceramic layers that are co-fired with metallic wiring layers and made from the same ceramic material. Further, the present invention relates to a method of manufacturing the electronic component-inspection wiring board.

2. Description of the Related Art

For inspection of conductive properties, operability, or defects of a microelectronic component such as an IC or LSI chip, a probe card has been proposed (see, for example, Patent Document 1). The probe card generally includes a wiring board comprising a base substrate composed of ceramic layers through which via-conductors are formed for passing inspection signals; and organic insulating layers that are formed on the base substrates; wherein thin film wiring layers and contact-pads are formed in or on the organic insulating layers so that the electronic component can directly or indirectly make electrical contact with the pads so as to be inspected by the inspection signals transmitted through the contact pads.

Patent Document 1: Japanese Patent Application Laid-Open No. 2006-275714 (pages 1-6, FIGS. 1-5)

3. Problem to be Solved by the Invention

In order to accurately collect inspection information from a microelectronic component, a rigid probe card-wiring board (or rigid electronic component-inspection wiring board) is necessarily required. Since a conventional electronic component-inspection wiring board comprises an organic insulating layer with a contact-pad formed thereon, the rigidity thereof is not sufficient. A probe card-wiring board having improved rigidity may be obtained if the organic layers formed on the base ceramic substrate are replaced with ceramic layers. However, if a higher density per unit volume is required of conductors wired in the ceramic layers (first ceramic laminate) than in the base ceramic substrate (second ceramic laminate), it will be very difficult to obtain a probe card-wiring board free of positional misalignment of the pads and the via-conductors, especially at the interface between the two ceramic laminates. If the first and second laminates are cofired at the same time, the position of a pad located on the uppermost layer or a via conductor exposed at the uppermost layer of the ceramic wiring board would deviate from their desired respective positions. As a result, inspection information of the microelectronic component neither can be accurately collected nor analyzed.

SUMMARY OF THE INVENTION

The present invention has been made to solve the above-noted problems of the related art, and an object of the invention is to provide an electronic component-inspection wiring board including plural wiring layers arranged between plural ceramic layers, where the wiring board has a first ceramic laminate having a wiring layer density per unit volume that is higher than that of the second ceramic laminate cofired with the first laminate, the rear surface of the first ceramic laminate overlies the front surface of the second ceramic laminate, and wherein via-conductors pass through the plural ceramic layers, which wiring board is capable of reliably securing conductivity across the first and second ceramic laminates, maintaining the electric continuity of the wiring layer and accurately collecting inspection information of an electronic component, and to a method of manufacturing the same.

The present invention has been achieved by providing relatively large diameter lands for electrically connecting the via-conductors of the first and second cofired ceramic laminates.

More particularly, in a first aspect, the present invention provides an electronic component-inspection wiring board which comprises: a first laminate composed of plural first ceramic layers and having plural pads formed on a front surface thereof for electrically connecting and transmitting inspection signals to an electronic component subject to inspection, wiring layers formed between the first ceramic layers, and plural via-conductors including those which connect the pads to respective wiring layers and including those which are exposed on a rear surface of the first laminate; and a second laminate composed of second ceramic layers made of the same ceramic material as that of the first ceramic layers, having plural via-conductors extending between front and rear surfaces of the second laminate, the rear surface of the first laminate overlying the front surface of the second laminate, wherein lands connecting a via-conductor exposed on the rear surface of the first laminate and a via-conductor exposed on the front surface of the second laminate are disposed between the first and second laminates, and the diameter of the land is 2-5 times larger than the diameter of a via-conductor connected to the land.

In a second aspect, the present invention provides an electronic component-inspection wiring board which comprises: a first laminate composed of plural first ceramic layers and having plural pads formed on a front surface thereof for electrically connecting and transmitting inspection signals to an electronic component subject to inspection, wiring layers formed between the first ceramic layers, plural via-conductors including those which connect the pads to respective wiring layers and including those which are exposed on a rear surface of the first laminate; and a second laminate composed of second ceramic layers made of the same ceramic material as that of the first ceramic layers, having plural via-conductors extending between front and rear surfaces of the second laminate, the rear surface of the first laminate overlying the front surface of the second laminate, wherein a first land connecting a via-conductor exposed on the rear surface of the first laminate and a via-conductor exposed on the front surface of the second laminate is disposed between the first and second laminates, a second land is present within said first and/or second laminates in a conductive path with said first land, and the diameter of said first land is larger than the diameter of said second land.

The density per unit volume of conductors such as the wiring layers and vias of the first laminate differs from that of the second laminate and consequently the firing shrinkages between the laminates are also different. In the electronic component-inspection wiring board according to the above aspects, even if the shrinkage ratios for the first and second laminates differ, the laminates are overlaid so that the via-conductor exposed on the rear surface of the first laminate and the via-conductor exposed on the front surface of the second laminate are unfailingly connected through the large size lands.

Therefore, electronic components such as an IC or LSI chip loaded directly or indirectly on the pads formed on the front surface of the first laminate can be supplied with inspection signals, and inspection information of such electronic components can be collected and analyzed without fail.

If the diameter of the land is less than twice the diameter of the via-conductor, it can become difficult to secure a conductive path between the land and the via-conductor. On the other hand, if the diameter of the land exceeds five times the diameter of the via-conductor, the area of the land becomes excessive, and consequently, via-conductors of a desired quantity or rather density cannot be accommodated. Thus, the diameter of the individual lands is limited to the above-described range.

If the diameter of a via-conductor not directly connected to the land is about equal to the diameter of the via-conductor connected to the land in the second laminate for electronic component inspection-ceramic wiring board, the manufacturing method can be advantageously facilitated according to the invention.

In a third aspect, the present invention provides an electronic component-inspection wiring board which comprises: a first laminate composed of plural first ceramic layers and having plural pads formed on a front surface thereof for electrically connecting and transmitting inspection signals to an electronic component subject to inspection, wiring layers formed between the first ceramic layers, and plural via-conductors including those connecting the pads to respective wiring layers and including those exposed on a rear surface of the first laminate; and a second laminate composed of second ceramic layers made of the same ceramic material as that of the first ceramic layers, having plural via-conductors extending between front and rear surfaces of the second laminate, the rear surface of the first laminate overlying the front surface of the second laminate, wherein lands connecting a via-conductor exposed on the rear surface of the first laminate and a via-conductor exposed on the front surface of the second laminate are disposed between the first and second laminates, and an amount of deviation in a connecting position between a center position of a land and a center position of a via-conductor in a lateral direction is larger at a peripheral edge of the wiring board than at a central portion of the wiring board.

Consequently, this invention can readily meet an increased wiring board size for electronic component inspection along its plane direction, and is tolerant to alignment errors in forming the lands and via-conductors at the time of manufacturing the wiring board.

Another feature of the invention is that only lands (and no other wiring) for connecting the via-conductor exposed on the rear surface of the first laminate and the via-conductor exposed on the front surface of the second laminate (base substrate) are disposed between the first laminate and the second laminate.

Consequently, lands alone are located between the first laminate and the second laminate, and the wiring layers are disposed between the plural ceramic layers forming the first laminate. Thus, the size and shape of the wiring layers are not limited by the lands. Therefore, the wiring layers can be formed into a desired width, into a desired shape and into a desired area, thereby making it possible to easily maintain the electric characteristic of the wiring layers. As a result, an electronic component such as an IC or LSI chip loaded on the front surface of the first laminate can be supplied with electric inspection signal and inspection information of such an electronic component can be accurately collected.

The material of the ceramic layers constituting the first and second laminates is a high temperature firing ceramic composed of alumina or a low temperature firing ceramic composed of glass-ceramic. The same material composition is commonly used in all the ceramic layers laminated in the electronic component-inspection wiring board according to the invention.

The wiring layer is adapted for any of signaling, power source supplying and grounding. Preferably, the wiring layer thickness is 5-40 μm and the wiring layer for signaling is made thicker than the wiring layer for grounding.

Additionally, the wiring layer and the via-conductor are formed of W or Mo in the case of a high temperature firing ceramic composed mainly of alumina, and Ag or Cu in the case of a low temperature firing ceramic composed of glass-ceramic.

Additionally, in the present invention, a blanket wiring layer for grounding or power source supplying, or a linear wiring layer for signaling, may be preferably formed between the rear surface of the first laminate and the front surface of the second laminate. In that case, the land is located within a through hole provided in the wiring layers through a gap.

In this manner, in addition to collection of inspection information, the wiring layer can be employed as a power source or grounding layer for supplying power to the electronic component or grounding to a wiring layer formed in the first laminate. Also, the linear wiring layer allows for a predetermined quantity of signal wires.

Additionally, the density per unit volume of conductor present in the first laminate is higher than the density per unit volume of conductor present in the second laminate.

Consequently, contact pads for contacting and inspecting the electronic component are formed on the front surface of the first laminate. The wiring layers between the first ceramic layers and the via-conductors for connecting the pads of the wiring layer are also formed in the first laminate. Rear surface pads and via-conductors penetrating the second ceramic layers are formed in the second laminate. Consequently, the wiring layers are securely disposed in the first laminate.

A first method for manufacturing the electronic component-inspection wiring board of the second aspect of the present invention comprises: a step of, providing plural green sheets made of the same ceramic material composed of two groups, including upper and lower side groups, forming plural via holes in the green sheets of the upper side group according to a relatively larger shrinkage ratio upon firing while forming plural via holes in the green sheets of the lower side group according to a relatively smaller shrinkage ratio upon firing; a step of forming via-conductors by filling respective via holes with a conductive paste containing a metallic powder; a step of forming wiring layers composed of the same conductive paste as that used to form the via-conductors on the surface of respective ones of the plural green sheets of the upper side group; and a step of forming a green sheet laminate by overlaying the green sheets of the two groups, upper and lower, such that a via-conductor exposed on the rear surface of the first group and a via-conductor exposed on the front surface of the second group are connected through a land disposed between the upper and lower groups, and firing the green sheet laminate.

Consequently, the via holes are formed in the green sheets of the upper side group so as to take into account a relatively larger shrinkage ratio, and the via holes are formed in the green sheets of the lower side group so as to take into account a relatively smaller shrinkage ratio. When the green sheet laminate is formed by overlaying these upper and lower groups, the via-conductor of the upper side group and the via-conductor of the lower side group are securely connected with one another through the relatively large diameter land.

Thus, even after the green sheet laminate is fired, the via-conductor of the first laminate having a relatively larger firing shrinkage and the via-conductor of the second laminate having a relatively smaller firing shrinkage are fired in a condition in which they are securely connected to the land. As a result, as compared with a conventional case where the same shrinkage ratio is applied to the green sheets of the first and second laminates, a problem of any one of the first laminate and the second laminate becoming loose on account of a shift in the position of the via-conductor is eliminated.

The via-conductor in the first laminate is located just below a pad formed on the front surface. Further, if only the land described above is disposed between the first laminate and the second laminate, a wiring layer having a predetermined width and area and capable of exerting a specified electric characteristic can be disposed between the ceramic layers of the first laminate. Thus, it is possible to provide an electronic component-inspection wiring board which can supply an electronic component loaded on the first laminate with electric current and accurately collect inspection information of the electronic component.

The shrinkage ratio defined in this specification is a value obtained by dividing the length of the green sheet before firing by the length of ceramic layer after firing (length before burning/length after burning) between the same two points. Normally the shrinkage ratio is about 1.1-1.2. Further, a difference between relatively larger and smaller shrinkage ratios is in a range of about 0.001-0.003. By using the shrinkage ratio and the shrinking difference in such a range above, the positions and dimensions of the pads formed on the uppermost layer and of the via-conductor located inside the second laminate can be brought close to each set value after cofiring.

A second method for manufacturing the electronic component-inspection of the wiring board of the third aspect of the present invention comprises: a step of, providing plural green sheets made of the same ceramic material composed of two groups, including upper and lower side groups, forming plural via holes in the green sheets of the upper side group according to a relatively larger shrinkage ratio while forming plural via holes in the green sheets of the lower side group according to a relatively smaller shrinkage ratio; a step of forming via-conductors by filling respective via holes with a conductive paste containing a metallic powder; a step of forming wiring layers composed of the same conductive paste as that used to form the via-conductors on the surface of respective ones of the plural green sheets of the upper side group; and a step of forming a green sheet laminate by overlaying each of the green sheets of the two groups, upper and lower, such that a via-conductor exposed on the rear surface of the first group and a via-conductor exposed on the front surface of the second group are connected through a land disposed between the upper and lower groups, and firing the green sheet laminate.

Consequently, the electronic component-inspection wiring board can be manufactured more easily. Also, even if the size thereof along its plane direction is increased, the wiring board can be easily manufactured.

In a preferred aspect, the method for manufacturing the electronic component-inspection wiring board of the present invention comprises a step of forming the green sheet laminate by overlaying the green sheets of the two groups, upper and lower, so as to connect exposed via-conductors between the rear surface of the upper side group and the front surface of the lower side group through a land having a diameter that is over two times as large as that of the via-conductors.

Consequently, the electronic component-inspection wiring board can be manufactured more securely.

Additionally, the method comprises a step of sintering the green sheet laminate in which plural green sheets having a different shrinkage ratio are overlaid to form the first and second laminates, and a step of forming pads above plural sintered via-conductors exposed on the front surface of the first laminate.

The above methods advantageously make it possible to manufacture an electronic component-inspection wiring board (probe-card wiring board) that is capable of unfailingly collecting inspection information on electronic components through the via-conductors formed in the first and second laminates when an electrode of an inspection object (microelectronic component to be inspected) is brought into contact with the pad or when the electrode of the electronic component is brought into contact with a probe-needle contacting with the pad.

DESCRIPTION OF REFERENCE NUMERALS

Figure 1:
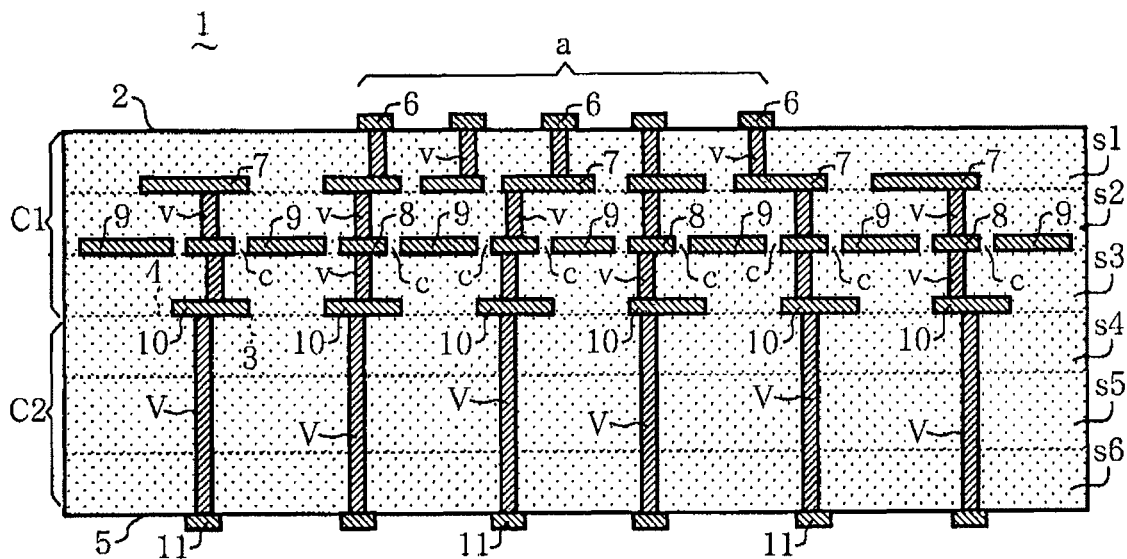
FIG. 1 is a vertical sectional view showing an electronic component-inspection wiring board according to an embodiment of the present invention.

Reference numerals used to identify various structural elements in the drawings include:
1, 1a, 1b, 1c: electronic component-inspection wiring board
2, 4: front surface
3, 5: rear surface
6: pad
7, 9, 9a, 19, 19a: wiring layer 8, 10, 18: land
C1: first laminate
C2: second laminate
s1-s6: ceramic layer
v, V: via-conductor
d1, d2: diameter
g1-g6: green sheet
h: via hole
GS: green sheet laminate

DETAILED DESCRIPTION OF THE PREFERRED EMBODIMENTS

Hereinafter, the present invention will be described in greater detail by reference to the drawings. However, the present invention should not be construed as being limited thereto.

FIG. 1 is a vertical sectional view showing an electronic component-inspection wiring board 1 (hereinafter also referred to as a wiring board for inspection) according to an embodiment of the present invention.

The wiring board for inspection 1 assumes a rectangular shape (square or rectangular shape) in plan view, and includes a first laminate C1 comprising plural ceramic layers s1-s3, a front surface 2 and a rear surface 3 overlying a second laminate C2. The second laminate C2 comprises plural ceramic layers s4-s6 made of the same material as that of ceramic layers s1-s3, and has a front surface 4 and a rear surface 5.

The above-mentioned ceramic layers s1-s6 are composed of alumina having the same material composition.

As shown in FIG. 1, the first laminate C1 includes wiring layers 7 and wiring layer 9 (continuously covering substantially the entire upper surface of intermediate ceramic layer S3, except for lands 8 and surrounding gaps c, hereinafter also called blanket wiring layer 9), formed between the ceramic layers s1-s3, plural pads 6 formed on the front surface 2, plural via-conductors v which form a conductive path between the front surface 2 and the rear surface 3 of the first laminate C1 through the wiring layers 7, 9 and lands 8, and the lands 8 disposed between the via-conductors v, v.

On the other hand, the second laminate C2 includes the above-mentioned ceramic layers s4-s6 and plural long via-conductors V penetrating ceramic layers s4-s6 in the thickness direction. In the meantime, lands (not shown) for connecting upper and lower via-conductors V, V within the second laminate C2 may be disposed between the ceramic layers s4-s6. However, the diameter of such a land is smaller than a land 10 provided between the first laminate C1 and the second laminate C2, described below.

In the first laminate C1, the plural pads 6 are formed in the vicinity of the center of the front surface 2 of the ceramic layer s1 on the topmost layer. Such plural pads 6 are disposed densely within a loading area "a" on which an inspection object electronic component is to be loaded and make individual contact with an electrode of the inspection object electronic component for inspecting the performance of such an electronic component.

The wiring layers 7, 9 and the lands 8 are made of W or Mo. The wiring layers 7 are formed in a specified pattern, and the blanket wiring layer 9 and the lands 8 have a circular shape. The wiring layers 7 and the lands 8 form a conduction path through the via-conductors v penetrating the ceramic layers s1-s3 and also form a conductive path with the pads 6.

Figure 2:
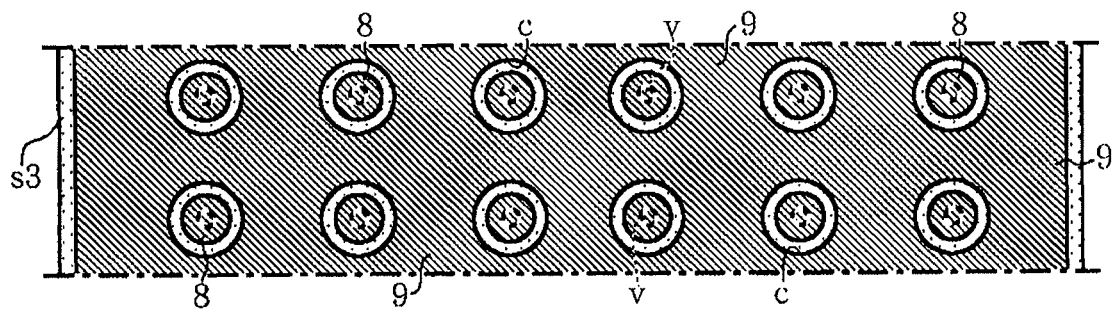
FIG. 2 is a horizontal partial sectional view showing the vicinity of a small diameter land in the wiring board for inspection.

As shown in the horizontal sectional view of FIG. 2, for example, the blanket wiring layer 9 which serves as a grounding layer or power source layer, and circular lands 8 formed inside each of plural ring-like gaps c as seen in plan view, are formed on the front surface of the ceramic layer s3, which is an intermediate layer, such that they are disposed on the same plane with a relatively high density. The lands 8 and the gaps c are disposed within the wiring layer 9 in a grid-like fashion as seen in plan view.

The via-conductor v penetrating the bottommost ceramic layer s3 is exposed on the side of the rear surface 3 of the first laminate C. Each of the via-conductors v is also composed of W or Mo.

Figure 3:
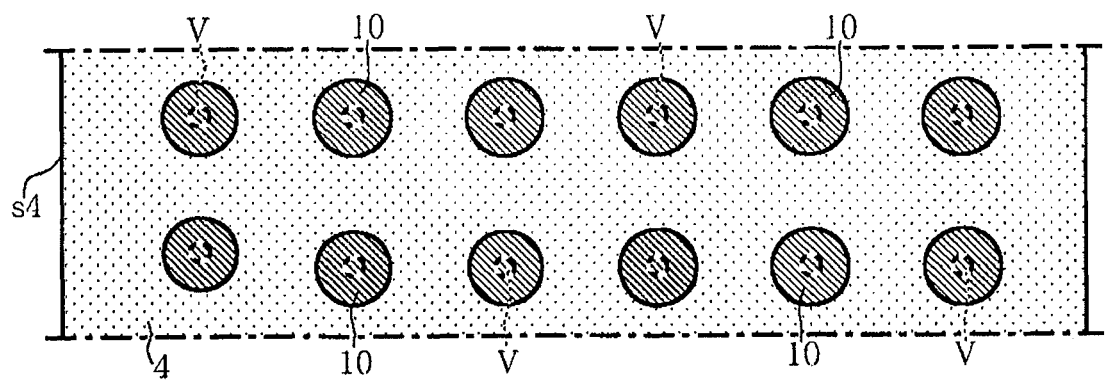
FIG. 3 is a horizontal partial sectional view showing the vicinity of a large diameter land in the wiring board.

The plurality of the lands 10 having a relatively large diameter of 0.60 mm and being circular in plan view are disposed in a grid-like fashion between the rear surface 3 of the ceramic layer s3 on the bottommost layer of the first laminate C1 and on the front surface 4 of the ceramic layer s4 on the topmost layer of the second laminate C2, as indicated in the horizontal partial sectional view of FIG. 3. As shown in FIG. 1, the lands 10 are separately disposed between the first and second laminates C1, C2. The lands 10 are made of W or Mo and the diameter of the land 10 is larger than that of the land 8, the via-conductor (0.15 mm in diameter) connected directly thereto, and the via-conductor v (0.15 mm in diameter) above the land 8.

As shown in FIG. 1, the via-conductor v exposed on the side of the rear surface 3 of the first laminate C1 is connected to the top face of each land 10. The plural lands 10 individually form a conductive path with the plural rear surface side pads 11 formed on the rear surface 5 of the second laminate C2 through plural long via-conductors V penetrating the ceramic layers s4-s6 of the second laminate C2. Further, the land 10 has a larger diameter than that of the via-conductor V.

As for the amount of deviation in the connecting positions between a center position of each of the plural lands 10 and a center position of a corresponding via-conductor V of the second laminate C2 in a lateral direction along the front and rear surfaces 3, 4, the amount at a peripheral edge of the first and second laminates C1, C2 is larger than at a central portion thereof.

Further, in the first laminate C1 and the second laminate C2, the density per unit volume of conductor composed of the pad 6, the wiring layers 7, 9, the land 8 and the via-conductor v is higher than the density per unit volume of conductor composed of the via-conductor V and the rear surface pads 11.

The long via-conductor V and the rear surface pad 11 are also made of W or Mo. The rear surface pad 11 outputs inspection information of an inspection object electronic component transmitted through the pad 6, the wiring layer 7, the lands 8, 10 and the via-conductors v, V to an outside electronic device.

Figure 4:
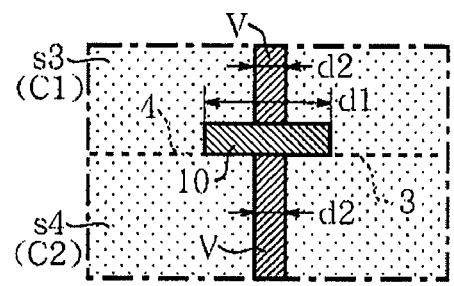
FIG. 4 is a partially enlarged sectional view showing the vicinity of the large diameter land.

As shown in a partial enlarged view of FIG. 4, the diameter d1 of the land 10 disposed between the first and second laminates C1, C2 is 2-5 times larger than the diameter d2 of the via-conductor v on the side of the first laminate C1 and the diameter d2 of the long via-conductor V penetrating the second laminate C2.

In the wiring board for inspection 1 described above, the via-conductor v exposed on the side of the rear surface 3 of the first laminate C1 and the long via-conductor V exposed on the front surface 4 of the second laminate C2 are securely connected through the relatively large diameter land 10. Consequently, a conductive path between the pad 6 on the front surface 2 and the rear surface pad 11 on the rear surface 5 can be securely made through the land 10. Further, the blanket wiring layer 9 and the relatively small diameter lands 8 with the ring-like gap c can be disposed in high density between the ceramic layers s2 and s3 of the first laminate C1. That is, because the wiring layer 9 and the small diameter lands 8 are not affected by the large diameter lands 10, a high electric characteristic can be maintained in the wiring layer 7 as well.

Thus, in the wiring board for inspection 1, by supplying electric current to an inspection object electronic component such as an IC chip mounted on pad 6 formed on the front surface 2 of the first laminate C1 or in contact with a probe (not shown) attached to the pad 6, inspection information of such an electronic component can be collected accurately.

In the wiring board for inspection 1, the blanket wiring layer 9 and the lands 8 may be formed between the ceramic layers s1 and s2 of the first laminate C1, and the predetermined pattern wiring layer 7 may be formed between the ceramic layers s2 and s3.

The above-described wiring board for inspection 1 can be manufactured as follows.

Figure 5:
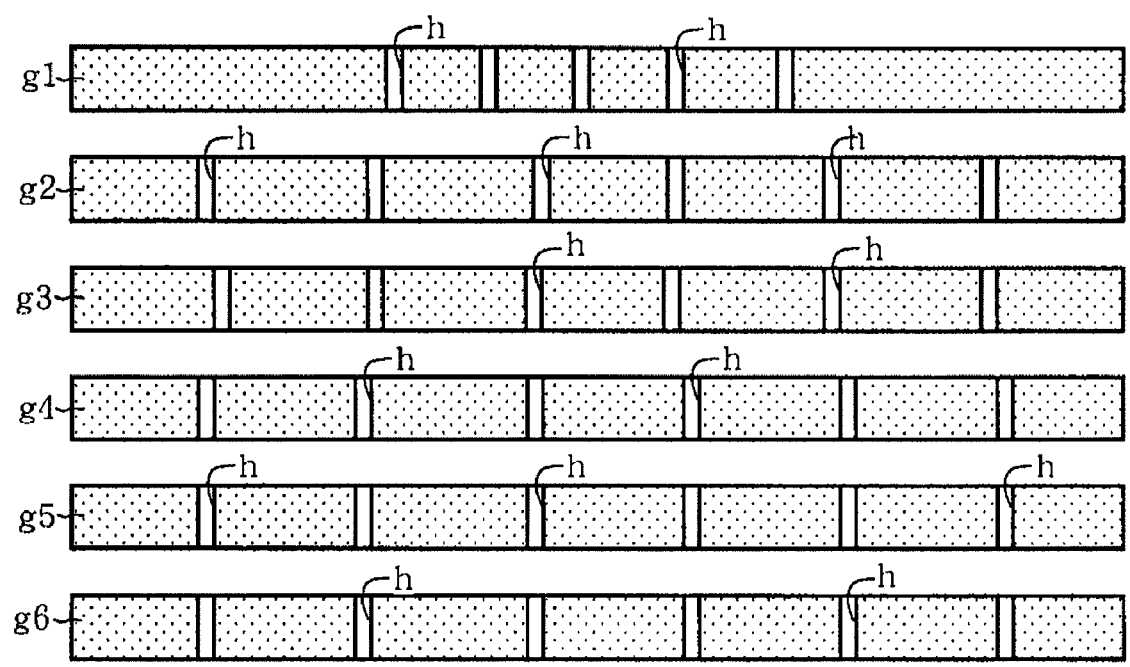
FIG. 5 is a schematic view showing a method for manufacturing the wiring board for inspection.

A ceramic slurry of the same material composition is produced by mixing alumina powder of the same kind, organic binder and solvent each in the same quantity, and six green sheets g1-g6 are produced using a doctor blade method as shown in FIG. 5.

In FIG. 5, the upper green sheets g1-g3 each has a thickness of about 180-300 μm, and are sintered to form the ceramic layers s1-s3 respectively, of the first laminate C1. The lower green sheets g4-g6 each has a thickness of about 180-516 μm, and are sintered to form the ceramic layers s4-s6, respectively, of the second laminate C2.

By adopting a shrinkage ratio of 1.2 for each of the green sheets g1-g3 (group) on the upper side, a plurality of the via holes "h" are formed at predetermined positions by punching as shown in FIG. 5. Further, by adopting a lower shrinkage ratio of 1.198 for each of the green sheets g4-g6 (group) on the lower side, a plurality of the via holes "h" are formed at predetermined positions in the same manner as described above (via hole formation process).

The respective via holes "h" in each of the green sheets g1-g6 is filled with conductive paste containing W powder using a metal mask and squeegee (not shown). As a result, as shown in FIG. 6, a via-conductor v (prior to sintering) is formed in respective via holes "h" of the green sheets g1-g6 (via-conductor formation step).

Figure 6:
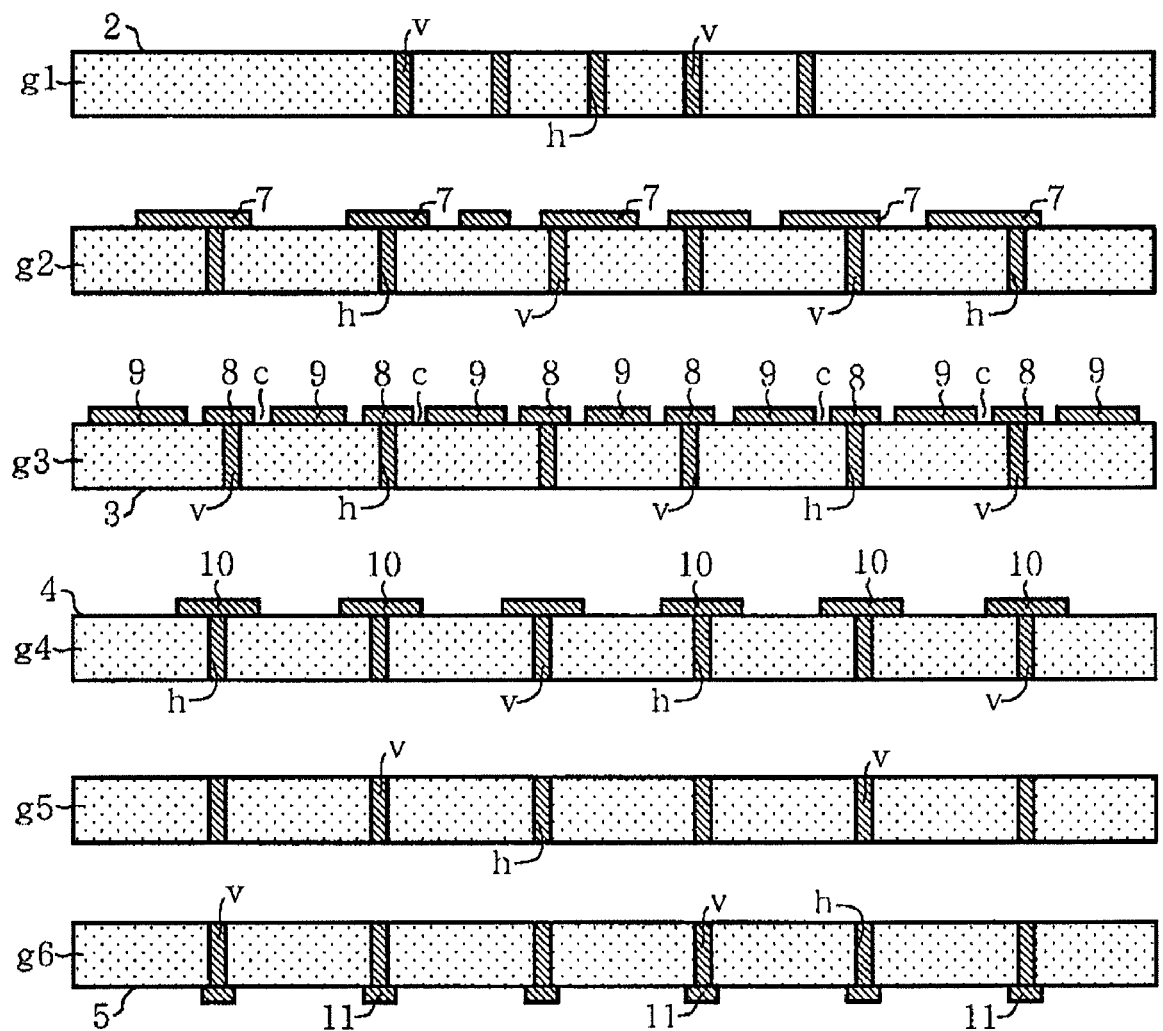
FIG. 6 is a schematic view showing a manufacturing process subsequent to that of FIG. 5.

Next, by screen-printing the same conductive paste as described above on the front surface of the green sheets g2-g4 and the rear surface 5 of the green sheet 6, as shown in FIG. 6, unsintered wiring layers 7, 9, lands 8, 10 and rear surface pads 11 each having a predetermined pattern are formed (wiring layer formation step). A land (not shown) may be formed on the front surface of the green sheets g5, g6 and just above the via-conductor V.

The wiring layer 9 which substantially covers the entire front surface is formed on green sheet g3 and small diameter lands 8 are formed within the plural gaps c each assuming a ring-like annular shape, formed in a grid-like pattern as seen in plan view, on the same plane as the wiring layer 9. Land 8 is connected to via-conductor v penetrating the green sheet g3.

The diameter (d1) of the large diameter land 10 is larger than the small-diameter land 8 formed on the front surface of the green sheet g3 and is set to be two-five times the diameter (d2) of each via-conductor v located above and below in FIG. 6. The land 10 is connected to the via-conductor v penetrating the green sheet g4.

The land 10 may be formed on the side of the rear surface 3 of the green sheet g3 which serves as the rear surface 3 of the first laminate C1. In this case, the difference in shrinkage ratio is, for example, increased by 0.003. Further, the wiring layer 7 may be formed on the rear surface side of the green sheet g2.

Then, the green sheets g1-g3 (upper side group) on the upper side and the green sheets g4-g6 (lower side group) on the lower side are pressurized in the thickness direction and overlaid so that the plural via-conductors v exposed on the rear surface 3 of the green sheet g3 on the bottommost layer (upper group) contact the top face of the plural lands 10 located on the front surface 4 of the green sheet g4 on the topmost layer (lower group).

Figure 7:
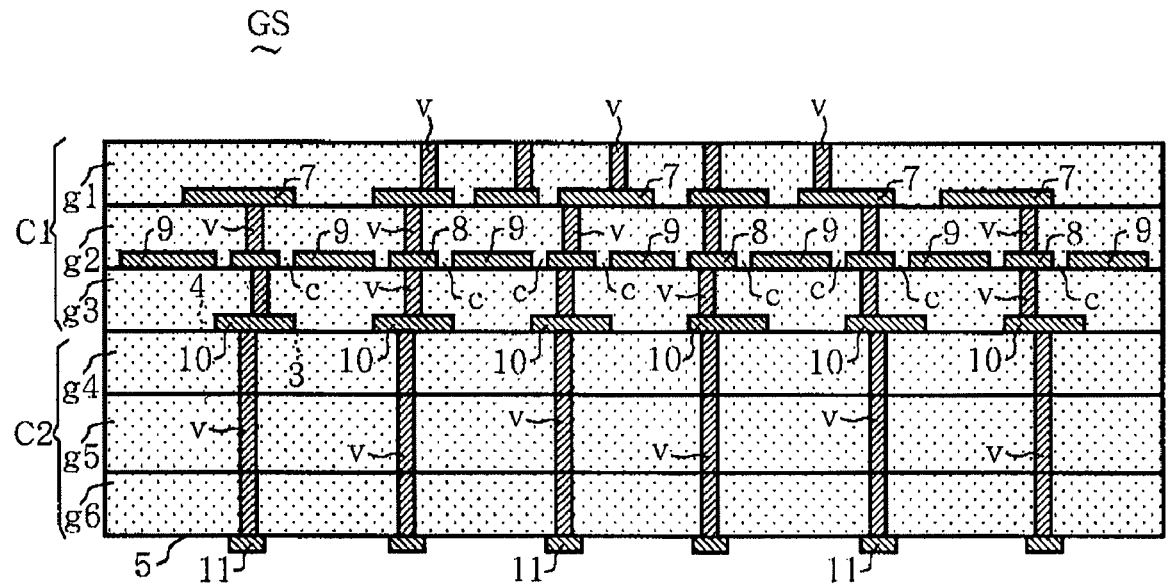
FIG. 7 is a schematic view showing a green sheet laminate obtained in a manufacturing process subsequent to FIG. 6.

Consequently, as shown in FIG. 7, a green sheet laminate GS is formed in which the first laminate C1 comprising the green sheets g1-g3 and the second laminate C2 comprising the green sheets g4-g6 are overlaid and the via-conductors v of both are connected to the land 10 (overlaying step). The resulting green sheet laminate GS is then fired at a predetermined temperature range (firing step).

Figure 8:
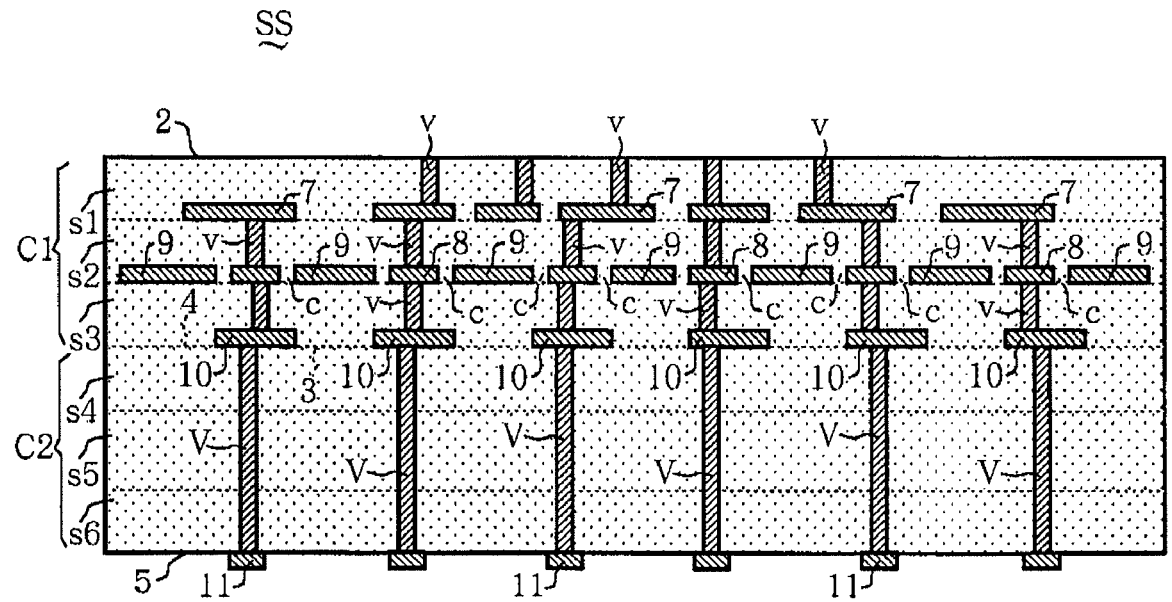
FIG. 8 is a schematic view showing a ceramic laminate obtained in a manufacturing process subsequent to FIG. 7.

As shown in FIG. 8, the ceramic laminate GS is then obtained, the ceramic laminate GS comprising the integrated first and second laminates C1, C2 having a front surface 2 and a rear surface 5 and composed of the ceramic layers s1-s6, the fired wiring layers 7, 9, the via-conductors v, V, the lands 8, 10 and the rear surface pads 11.

In the firing step, the green sheet laminate GS contracts to a relatively larger extent in the plane direction and in the thickness direction at a shrinkage ratio of 1.2. This is because the wiring layers 7, 9 and lands 8 are present in a relatively high density within the green sheets g1-g3 of the upper layer side group.

On the other hand, in the firing step, the green sheets g4-g6 of the lower layer side group contract to a relatively smaller extent in the plane direction and in the thickness direction at a shrinkage ratio of 1.198. This is because the green sheets g4-g6 have plural long via-conductors V in a relatively low density except for the lands 10 and rear surface pads 11. Even if different shrinkage ratios are adopted depending on each of the first laminate C1 and the second laminate C2, connection between the land 10 and a corresponding via-conductor v can still be securely maintained. This is because the diameter (d1) of each land 10 formed on the front surface 4 of the green sheet g4 is set to be two-five times the diameter (d2) of the individual via-conductors v exposed on the rear surface 3 of the green sheet g3.

As a result, as shown in FIG. 8, in the ceramic laminate SS, a conductive path between a pad 6, a wiring layer 7 and a land 8 can be secured through respective via-conductors v penetrating the ceramic layers s1-s3 and a land 10. Also, the rear surface pad 11 and land 10 can form a conductive path through the long via-conductor V penetrating the ceramic layers s4-s6. Further, as for the amount of deviation of connecting positions between a center position of each of the plural lands 10 and a center position of a corresponding via-conductor V of the second laminate C2 in a lateral direction along the front and rear surfaces 3, 4, the amount of deviation at a peripheral edge of the first and second laminates C1, C2 is larger than at a central portion thereof.

After the front surface 2 of the ceramic laminate SS (ceramic layer s1) is polished to a flat surface, the pads 6 for contact with an inspection object electronic component are formed on individual ones of plural via-conductors v exposed in the central portion of the polished front surface 2.

Figure 9:
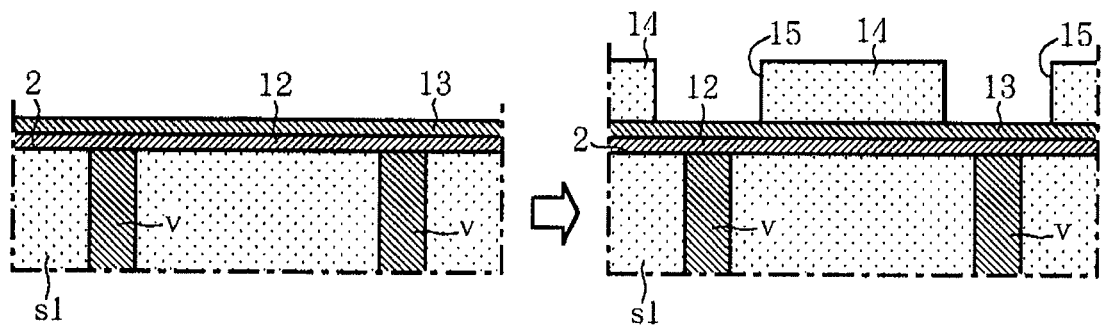
FIG. 9 is a schematic view showing a manufacturing process subsequent to FIG. 8.

As shown on the left side of FIG. 9, Ti thin film layer 12 and Cu thin film layer 13 are formed on the front surface 2 of the ceramic layer s1 by successive sputtering operations. As shown on the right side of FIG. 9, a resist layer 14 composed of photosensitive resin is formed on the Cu thin film layer 13 and after that, a cylindrical through hole 15 is formed above respective via-conductors v using a lithographic technique.

Figure 10:
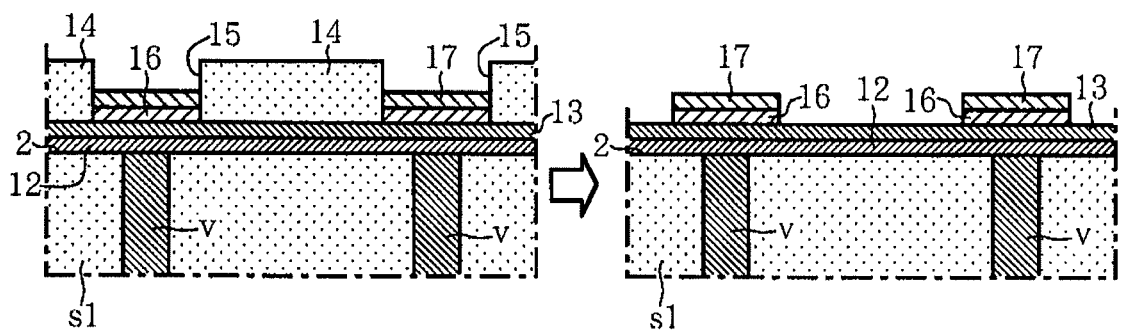
FIG. 10 is a schematic view showing a manufacturing process subsequent to FIG. 9.

Next, as shown on the left side of FIG. 10, Cu plating layer 16 and Ni plating layer 17 are successively formed on the Cu thin film layer 13 exposed on the bottom face of respective through holes 15 by electrolytic plating. In this condition, as shown on the right side of FIG. 10, the resist layer 14 is dissolved and removed with a developing liquid.

Figure 11:
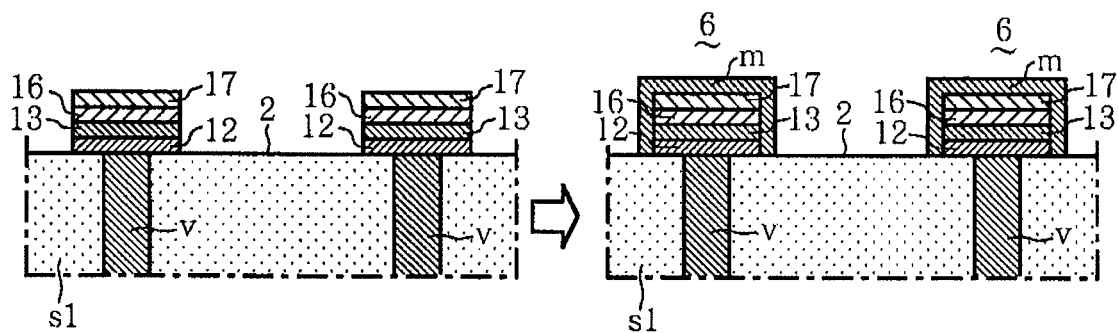
FIG. 11 is a schematic view showing a manufacturing process subsequent to FIG. 10.

Further, as shown on the left side of FIG. 11, Ti thin film layer 12 and Cu thin film layer 13 not covered by the Cu plating layer 16 and Ni plating layer 17 are removed by contacting with an etching solution. As a result, four layers, that is, the Ti thin film layer 12, Cu thin film layer 13, Cu plating layer 16 and Ni plating layer 17 are formed cylindrically above respective via-conductors v exposed on the front surface 2. Then, as shown on the right side of FIG. 11, the entire surface of the cylinder composed of the four layers is covered with an Au plating layer "m" by electrolytic plating. In this manner, the plural pads 6 are formed on the front surface 2 with high accuracy.

As a result, the plural pads 6 for contact with an electrode of the inspection object electronic component are formed in a mounting area "a" of the front surface 2. The wiring board for inspection 1 shown in FIG. 1 is thus obtained, in which an electrically conductive path is reliably formed between the pads 6 and corresponding rear pads 11 through the wiring layers 7, the lands 8, 10 and the via-conductors v, V.

Also, a probe (not shown) may be attached to the pad 6.

According to the manufacturing method of the wiring board for inspection 1, via holes "h" are formed at positions based on a larger shrinkage ratio in the green sheets g1-g3 of the upper side group and via holes "h" are formed at positions based on a smaller shrinkage ratio in the green sheets g4-g6 of the lower side group. The diameter d1 of respective lands 10 is set to two to five times the diameter d2 of corresponding via-conductors v exposed on the rear surface 3 of the green sheet g3. Thus, the positional accuracy of the two via-conductors v, V and the pad 6 is improved. Also, the two via-conductors v, V are securely connected to one another through the first land 10. Further, because large diameter lands 10 are disposed between the first laminate C1 and the second laminate C2, the wiring layer 9 which has a specified area and serves for grounding can be disposed securely between the ceramic layers s2 and s3 of the first laminate C1. Thus, it is possible to provide a wiring board for inspection 1 which is capable of supplying electric current to the inspection object electronic component loaded on the pads 6 formed on the front surface 2 of the first laminate C1 and collecting inspection information of such an electronic component from the rear surface pads 11 through the lands 10 and the via-conductors v, V.

Figure 12:
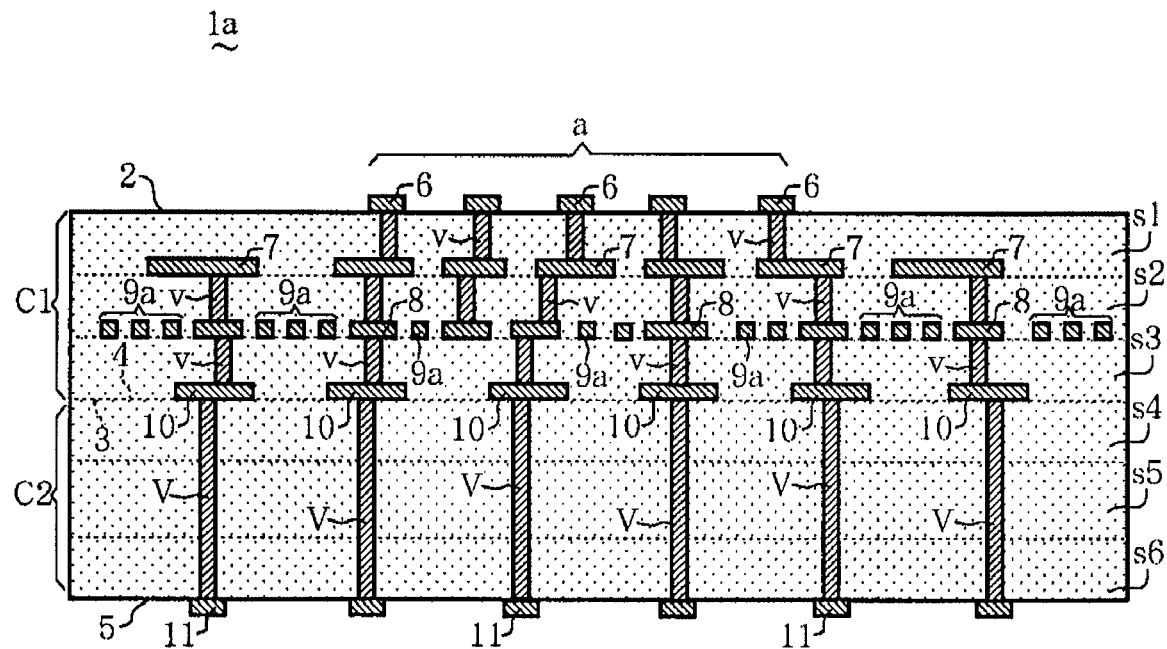
FIG. 12 is a vertical sectional view showing a wiring board for electronic component inspection according to a modified embodiment.

FIG. 12 is a vertical sectional view showing a wiring board for inspection 1a of a modified embodiment. In the wiring board for inspection 1a, as shown in FIG. 12, the first laminate C1 and the second laminate C2 are integrally overlaid similar to the wiring board for inspection 1.

One difference is that narrow linear signal wiring layers 9a are disposed around respective plural lands 8 which connect upper and lower via-conductors v between the ceramic layers S2 and S3 of the first laminate C1. In the meantime, large diameter lands 10 are disposed between the first laminate C1 and the second laminate C2 in the vertical direction of plural lands 10 so as to electrically connect the via-conductors v on the side of the first laminate C1 and the long via-conductors V on the side of the second laminate C2. Also, the diameter d1 of the land 10 is two-five times larger than the diameter d2 of corresponding via-conductor v, V which electrically connect with one another in the vertical direction.

Although the wiring board for inspection 1a can be manufactured in the same way as the wiring board for inspection 1, a conductive paste which serves as the wiring layer 9a for signaling is formed within the first laminate C1 instead of the blanket wiring layer 9. As a result, the difference in firing shrinkage between the first laminate C1 formed from the green sheets g1-g3 and the second laminate C2 formed from the green sheets g4-g6 is slightly smaller than when manufacturing the wiring board for inspection 1. Thus, the shrinkage ratio of the green sheets g4-g6 of the lower side group is set equal to or slightly larger than the shrinkage ratio of the green sheets g1-g3 of the upper side group so as to form the via holes "h."

The wiring board for inspection 1a described above can operate the same way as the wiring board for inspection 1, and additionally, can exert the same effect.

Further, the land 8 and the wiring layer 9a may be formed between the ceramic layers s1 and s2 in the first laminate C1 and the wiring layer 7 may be formed between the ceramic layers s2 and s3.

Figure 13:
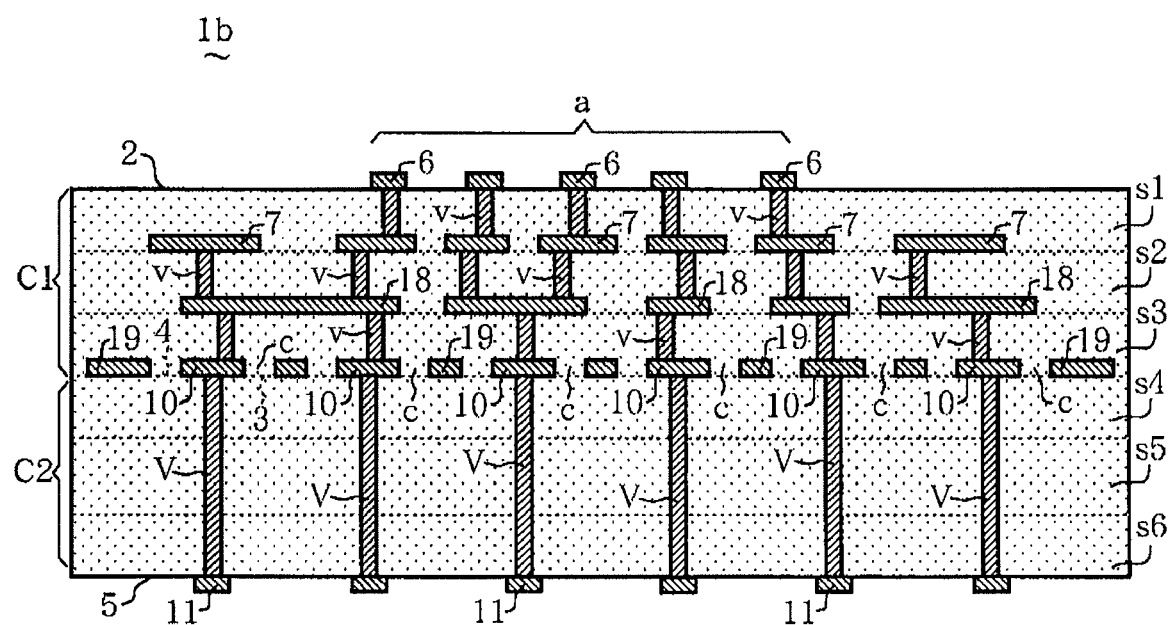
FIG. 13 is a vertical sectional view showing an electronic component-inspection wiring board according to yet a further embodiment.

FIG. 13 is a vertical sectional view showing a wiring board for electronic component inspection (hereinafter referred to as wiring board for inspection) 1b according to a modified embodiment of the present invention.

The wiring board for inspection 1b assumes a rectangular shape (square or rectangular shape) in plan view, and as shown in FIG. 13, comprises a first laminate C1 including plural ceramic layers s1-s3 and having a front surface 2 and a rear surface 3 overlying a second laminate C2. The second laminate C2 comprises plural ceramic layers s4-s6 made of the same ceramic material as that of ceramic layers s1-s3 and has a front surface 4 and a rear surface 5.

As shown in FIG. 13, the first laminate C1 includes wiring layers 7, 18 formed in the ceramic layers s1-s3, plural pads 6 formed on the front surface 2 and plural via-conductors v forming a conductive path between the front and rear surfaces 2 and 3. The second laminate C2 includes wiring layers 19 formed on the front surface 4, lands 10 and plural via-conductors V penetrating in the thickness direction of the ceramic layers s4-s6.

In the first laminate C1, the plural pads 6 are formed in the vicinity of the central portion of the front surface 2 of the ceramic layer s1 on the topmost layer. The plural pads 6 are disposed densely within the loading area "a" on which an inspection object electronic component is to be loaded and make individual contact with electrodes of the inspection object electronic component so as to inspect the performance of such an electronic component.

The wiring layers 7, 18 are made of W or Mo and have a predetermined pattern and form a conductive path through the via-conductor v penetrating the ceramic layers s1-s3 and also with the pad 6. The via-conductor v penetrating the bottommost ceramic layer s3 is exposed on the side of the rear surface 3 of the first laminate C. Each via-conductor v is also made of W or Mo.

Figure 14:
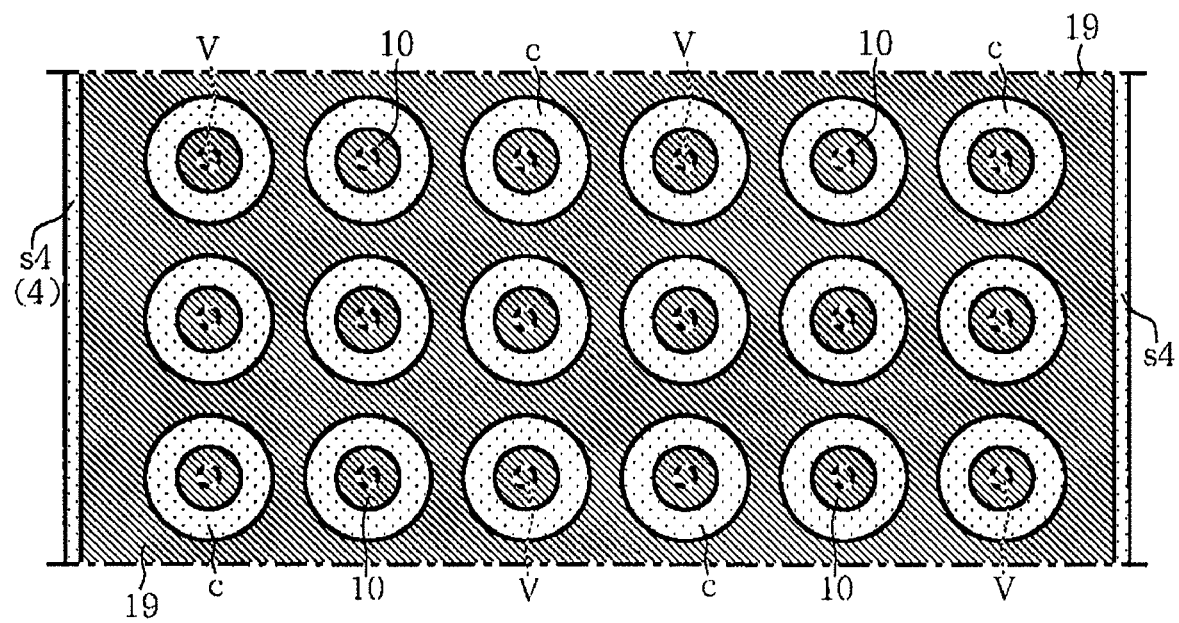
FIG. 14 is a horizontal partial sectional view showing the vicinity of the large diameter land in the wiring board for inspection.

In the second laminate C2, as shown in the horizontal sectional view of FIG. 14, for example, the blanket wiring layer 19 which serves as a grounding layer or a power source layer, and the lands 10 (circular in plan view formed within each of plural gaps c having a ring-like shape in plan view) are formed on the same plane of a front surface 4 of the topmost layer ceramic layer s4. The wiring layer 19 and the land 10 are also made of W or Mo, and the gaps c and the lands 10 are arranged in the grid-like shape within the wiring layer 19 in plan view.

As shown in FIG. 13, the via-conductor v exposed on the side of the rear surface 3 of the first laminate C1 is connected to the top face of the land 10. The plural lands 10 form a conductive path with respective plural rear surface pads 11 formed on the rear surface 5 of the second laminate C2 through individual plural long via-conductors V penetrating the ceramic layers s4-s6 of the second laminate C2.

In the first laminate C1 and the second laminate C2, the density per unit volume of the conductor composed of the pad 6, the wiring layers 7, 18 and the via-conductor v is higher than the density per unit volume of the conductor composed of the wiring layer 19, the land 10, and the via-conductor V and the rear surface pad 11.

In the meantime, the long via-conductor V and the rear surface pad 11 are also made of W or Mo. The rear surface pad 11 outputs inspection information of an inspection object electronic component transmitted through the pads 6, the lands 10 and the via-conductors v, V to an outside electronic device.

Figure 15:
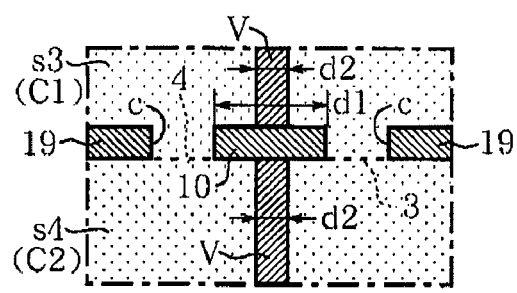
FIG. 15 is a partially enlarged sectional view showing the vicinity of the large diameter land.

As shown in the partially enlarged diagram of FIG. 15, the diameter d1 of each land 10 is 2-5 times larger than the diameter d2 of the via-conductor v of the first laminate C1 and the diameter d2 of the long via-conductor V penetrating the second laminate C2.

In the wiring board for inspection 1, the via-conductor v exposed on the side of the rear surface 3 of the first laminate C1 is electrically connected to the long via-conductor V exposed on the front surface 4 of the second laminate C2 through the land 10. Consequently, a conductive path between the pad 6 on the front surface 2 and the rear surface pad 11 on the side of the rear surface 5 can be securely made through the land 10 and the via-conductors v, V. As a result, electric current can be supplied to an IC chip loaded on the pads 6 formed on the front surface 2 of the first laminate C1, and collection of inspection information is accurately enabled.

The wiring board for inspection 1b described above can be manufactured in the same manner as the wiring board for inspection 1. In its wiring layer formation step, the blanket wiring layer 19 which covers substantially the entire face of the front surface 4 is formed on green sheet g4 and at the same time, the circular lands 10 (formed within each of the plural gaps c having a ring-like shape in plan view) are formed in a grid-like configuration on the same plane as the wiring layer 19.

Figure 16:
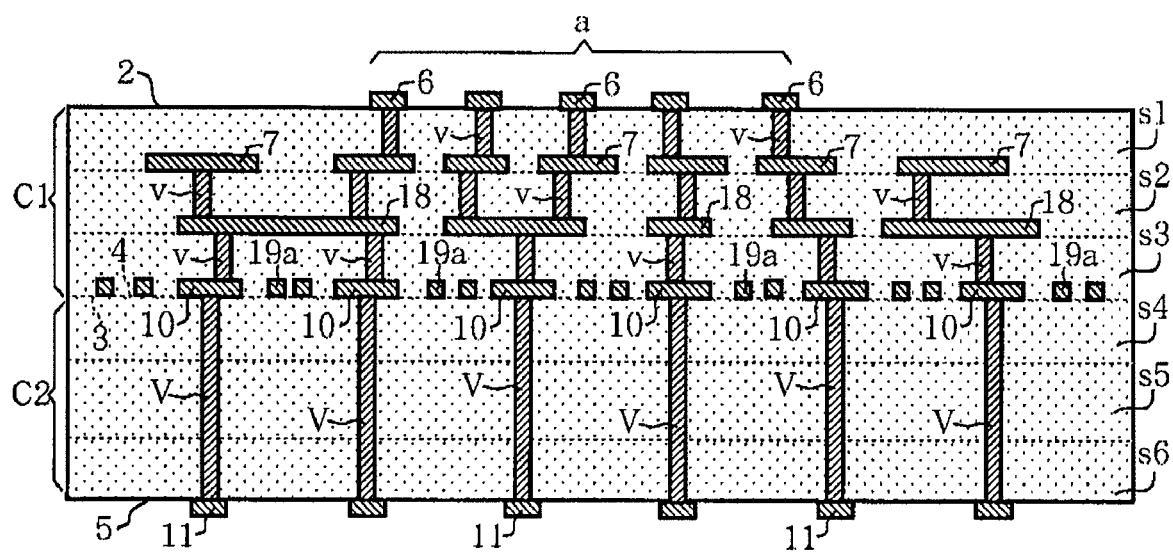
FIG. 16 is a vertical sectional view showing a wiring board for electronic component inspection according to a modified embodiment.

FIG. 16 is a vertical sectional view showing a wiring board for inspection 1c according to a further modified embodiment.

In the wiring board for inspection 1c, as shown in FIG. 16, the first laminate C1 and the second laminate C2 are integrally overlaid like the wiring board for inspection 1.

The wiring board for inspection 1a is different from the wiring board for inspection 1 in that the plural lands 10 are disposed in a grid-like configuration between the rear surface 3 of the first laminate C1 and the front surface 4 of the second laminate C2, and that narrow linear signal wiring layers 19a are disposed on the same plane. The via-conductor v of the first laminate C1 and the long via-conductor V of the second laminate C2 are connected through respective plural lands 10 in the vertical direction. The diameter d1 of each land 10 is 2-5 times larger than the diameter d2 of the via-conductors v, V upper and lower.

The wiring board for inspection 1c can be manufactured in the same way as the wiring board for inspection 1. In its wiring layer formation step, linear conductive paste which serves as the signal wiring layer 9a is formed on the front surface 4 of the second laminate C2. As a result, the difference in firing shrinkage between the first laminate C1 composed of the green sheets g1-g3 and the second laminate C2 composed of the green sheets g4-g6 is slightly larger than when the wiring board for inspection 1 is formed. For this reason, preferably, the shrinkage ratio of the green sheets g4-g6 of the lower side group is smaller by about 0.003 or more than the shrinkage ratio of the green sheets g1-g3 of the upper side group to form the via holes "h". The conductive paste of the wiring layer 19a may be formed on the rear surface 3 of the green sheet g3 which serves as the rear surface 3 of the first laminate C1.

The wiring board for inspection 1c can be obtained in the same manner as the wiring board for inspection 1, and additionally can exert the same effect.

The present invention is not restricted to the respective embodiments described above. The ceramic layer and green sheet forming the first and second laminates may be made of any ceramic material having the same material composition and component composition, for example, a high temperature fired ceramic such as aluminum nitride or mullite or a low/high temperature fired ceramic such as glass-ceramic (for example, alumina).

Further, the plural large diameter lands formed individually between the rear surface of the first laminate and the front surface of the second laminate may be disposed in a staggered fashion in plan view.

Further, the lands may be formed in a substantially square or regular polygonal shape in plan view, and in these cases, the shortest distance in the plan view is regarded as the diameter.

Having described our invention as related to the present embodiments, it is our intention that the invention not be limited by any of the details of the description, unless otherwise specified, but rather be construed broadly within its spirit and scope as set out in the accompanying claims.

This application is based on Japanese Patent Application No. 2006-332059 filed Dec. 8, 2006, Japanese Patent Application No. 2007-36167 filed Feb. 16, 2007, and Japanese Patent Application No. 2007-36064 filed Feb. 16, 2007, the above-noted applications incorporated herein by reference in their entirety.

What is claimed is:

1. An electronic component-inspection wiring board, which comprises: a first laminate composed of plural first ceramic layers and having plural pads formed on a front surface thereof for electrically connecting and transmitting inspection signals to an electronic component subject to inspection, wiring layers formed between the first ceramic layers, and plural via-conductors including those which connect respective pads to the wiring layers and including those which are exposed on a rear surface of the first laminate; and
   a second laminate composed of second ceramic layers made of the same ceramic material as that of the first ceramic layers, having plural via-conductors extending between front and rear surfaces of the second laminate, the rear surface of the first laminate overlying the front surface of the second laminate,
   wherein a land connecting a via-conductor exposed on the rear surface of the first laminate and a via-conductor exposed on the front surface of the second laminate is disposed between the first and second laminates, and the diameter of the land is 2-5 times larger than the diameter of a via-conductor connected to the land,
   wherein an amount of conductor present per unit volume of the first laminate is higher than an amount of conductor present per unit volume of the second laminate,
   wherein the first laminate is fixed to the second laminate.

2. The electronic component-inspection wiring board according to claim 1, wherein the only wiring disposed between the first and second laminates consists of lands connecting a via-conductor exposed on the rear surface of the first laminate and a via-conductor exposed on the front surface of the second laminate.

3. The electronic component-inspection wiring board according to claim 1, wherein (i) the lands connecting a via-conductor exposed on the rear surface of the first laminate and a via-conductor exposed on the front surface of the second laminate, and (ii) wiring layers located around the lands, are disposed between the first laminate and the second laminate.

4. The electronic component-inspection wiring board according to claim 3, wherein the wiring layers disposed between the first laminate and the second laminate are blanket wiring layers for grounding or power source supply, or are linear wiring layers for signaling.

5. The electronic component-inspection wiring board according to claim 1, wherein the wiring layer is adapted for any one of signaling, power source supply and grounding.

6. The electronic component-inspection wiring board according to claim 1, wherein said land disposed between the first and second laminates is bonded to each of a via-conductor exposed on the rear surface of the first laminate and to a via-conductor exposed on the front surface of the second laminate.

7. An electronic component-inspection wiring board, which comprises:
   a first laminate composed of first plural ceramic layers and having plural pads formed on a front surface thereof for electrically connecting and transmitting inspection signals to an electronic component subject to inspection, wiring layers formed between the first ceramic layers, and plural via-conductors including those which connect respective pads to the wiring layers and including those which are exposed on a rear surface of the first laminate; and
   a second laminate composed of second ceramic layers made of the same ceramic material as that of the first ceramic layers, having plural via-conductors extending between front and rear surfaces of the second laminate, the rear surface of the first laminate overlying the front surface of the second laminate,
   wherein a first land connecting a via-conductor exposed on the rear surface of the first laminate and a via-conductor exposed on the front surface of the second laminate is disposed between the first and second laminates, a second land is present within said first and/or second laminates in a conductive path with said first land, and the diameter of said first land is larger than the diameter of said second land,
   wherein an amount of conductor present per unit volume of the first laminate is higher than an amount of conductor present per unit volume of the second laminate,
   wherein the first laminate is fixed to the second laminate.

8. The electronic component-inspection wiring board according to claim 7, wherein the only wiring disposed between the first and second laminates consists of lands connecting a via-conductor exposed on the rear surface of the first laminate and a via-conductor exposed on the front surface of the second laminate.

9. The electronic component-inspection wiring board according to claim 7, wherein the diameter of the land is 2-5 times larger than the diameter of a via-conductor connected to the land.

10. The electronic component-inspection wiring board according to claim 7, wherein the wiring layer is adapted for any one of signaling, power source supply and grounding.

11. The electronic component-inspection wiring board according to claim 7, wherein said land disposed between the first and second laminates is bonded to each of a via-conductor exposed on the rear surface of the first laminate and to a via-conductor exposed on the front surface of the second laminate.

12. An electronic component-inspection wiring board which comprises: a first laminate composed of plural first ceramic layers and having plural pads formed on a front surface thereof for electrically connecting and transmitting inspection signals to an electronic component subject to inspection, wiring layers formed between the first ceramic layers, and plural via-conductors including those which connect respective pads to the wiring layers and including those which are exposed on a rear surface of the first laminate; and
   a second laminate composed of second ceramic layers made of the same ceramic material as that of the first ceramic layers, having plural via-conductors traversing front and rear surfaces of the second laminate, the rear surface of the first laminate overlying the front surface of the second laminate,
   wherein lands connecting a via-conductor exposed on the rear surface of the first laminate and a via-conductor exposed on the front surface of the second laminate are disposed between the first and second laminates, and an amount of deviation in a connecting position between a center position of a land and a center position of a via-conductor in a lateral direction is larger at a peripheral edge of the wiring board than at a central portion of the wiring board,
   wherein an amount of conductor present per unit volume of the first laminate is higher than an amount of conductor present per unit volume of the second laminate,
   wherein the first laminate is fixed to the second laminate.

13. The electronic component-inspection wiring board according to claim 12, wherein the only wiring disposed between the first and second laminates consists of lands connecting a via-conductor exposed on the rear surface of the first laminate and a via-conductor exposed on the front surface of the second laminate.

14. The electronic component-inspection wiring board according to claim 12, wherein the diameter of the land is 2-5 times larger than the diameter of a via-conductor connected to the land.

15. The electronic component-inspection wiring board according to claim 12, wherein the wiring layer is adapted for any one of signaling, power source supply and grounding.

16. The electronic component-inspection wiring board according to claim 12, wherein individual ones of said lands disposed between the first and second laminates are bonded to each of a via-conductor exposed on the rear surface of the first laminate and to a via-conductor exposed on the front surface of the second laminate.

17. A method of manufacturing an electronic component-inspection wiring board, said wiring board comprising:
   a first laminate composed of first plural ceramic layers and having plural pads formed on a front surface thereof for electrically connecting and transmitting inspection signals to an electronic component subject to inspection, wiring layers formed between the first ceramic layers, and plural via-conductors including those which connect respective pads to the wiring layers and including those which are exposed on a rear surface of the first laminate; and
   a second laminate composed of second ceramic layers made of the same ceramic material as that of the first ceramic layers, having plural via-conductors extending between front and rear surfaces of the second laminate, the rear surface of the first laminate overlying the front surface of the second laminate, wherein a first land connecting a via-conductor exposed on the rear surface of the first laminate and a via-conductor exposed on the front surface of the second laminate is disposed between the first and second laminates, a second land is present within said first and/or second laminates in a conductive path with said first land, and the diameter of said first land is larger than the diameter of said second land, wherein an amount of conductor present per unit volume of the first laminate is higher than an amount of conductor present per unit volume of the second laminate, wherein the first laminate is fixed to the second laminate, said method comprising:

providing plural green sheets made of the same ceramic material composed of two groups, including upper and lower side groups, forming plural via holes in the green sheets of the upper side group according to a relatively larger shrinkage ratio while forming plural via holes in the green sheets of the lower side group according to a relatively smaller shrinkage ratio upon firing;

forming via-conductors by filling respective via holes with a conductive paste containing a metallic powder;

forming wiring layers composed of the same conductive paste as that used to form the via-conductors on the surface of respective ones of the plural green sheets of the upper side group; and forming a green sheet laminate by overlaying the green sheets of the two groups, upper and lower, such that a via-conductor exposed on the rear surface of the first group and a via-conductor exposed on the front surface of the second group are connected through a land disposed between the upper and lower groups; and firing the green sheet laminate.

18. The method of manufacturing an electronic component-inspection wiring board according to claim 17, wherein the diameter of a land connecting via-conductors in the first and second groups is at least twice as large as that of a via-conductor connected to the land.

19. A method of manufacturing an electronic component-inspection wiring board, said wiring board comprising:

a first laminate composed of plural first ceramic layers and having plural pads formed on a front surface thereof, wiring layers formed between the first ceramic layers, and plural via-conductors including those which connect respective pads to the wiring layers and including those which are exposed on a rear surface of the first laminate; and a second laminate composed of second ceramic layers made of the same ceramic material as that of the first ceramic layers, having plural via-conductors extending between front and rear surfaces of the second laminate, the rear surface of the first laminate overlying the front surface of the second laminate, wherein lands connecting a via-conductor exposed on the rear surface of the first laminate and a via-conductor exposed on the front surface of the second laminate are disposed between the first and second laminates, and an amount of deviation in a connecting position between a center position of a land and a center position of a via-conductor in a lateral direction is larger at a peripheral edge of the wiring board than at a central portion of the wiring board, wherein an amount of conductor present per unit volume of the first laminate is higher than an amount of conductor present per unit volume of the second laminate, wherein the first laminate is fixed to the second laminate, said method comprising:

providing plural green sheets made of the same ceramic material composed of two groups, including upper and lower side groups, forming plural via holes in the green sheets of the upper side group according to a relatively larger shrinkage ratio while forming plural via holes in the green sheets of the lower side group according to a relatively smaller shrinkage ratio;

forming via-conductors by filling respective via holes with a conductive paste containing a metallic powder;

forming wiring layers composed of the same conductive paste as that used to form the via-conductors on the surface of respective ones of the plural green sheets of the upper side group; and forming a green sheet laminate by overlaying the green sheets of the two groups, upper and lower, such that a via-conductor exposed on the rear surface of the first group and a via-conductor exposed on the front surface of the second group are connected through a land disposed between the upper and lower groups; and firing the green sheet laminate.

20. The method of manufacturing an electronic component-inspection wiring board according to claim 19, wherein the diameter of a land connecting via-conductors in the first and second groups is at least twice as large as that of a via-conductor connected to the land.

* * * * *